United States Patent [19]

Bauer et al.

[11] Patent Number: 4,728,888
[45] Date of Patent: Mar. 1, 1988

[54] MAGNETOMETER WITH TIME CODED OUTPUT OF MEASURED MAGNETIC FIELDS

[75] Inventors: Harald Bauer, Nuremberg; Gerhard Hettich, Rosstal, both of Fed. Rep. of Germany

[73] Assignee: Robert Bosch GmbH, Stuttgart, Fed. Rep. of Germany

[21] Appl. No.: 745,771
[22] PCT Filed: Nov. 14, 1984
[86] PCT No.: PCT/DE84/00243
§ 371 Date: Jun. 10, 1985
§ 102(e) Date: Jun. 10, 1985
[87] PCT Pub. No.: WO85/02911
PCT Pub. Date: Jul. 4, 1985

[30] Foreign Application Priority Data

Dec. 17, 1983 [DE] Fed. Rep. of Germany ....... 3345712

[51] Int. Cl.⁴ ............... G01R 33/04; G01C 17/28
[52] U.S. Cl. ................................ 324/253; 33/361
[58] Field of Search .................. 324/253–255, 324/247; 33/361

[56] References Cited

U.S. PATENT DOCUMENTS

| | | | |
|---|---|---|---|
| 3,812,428 | 5/1974 | Trenkler | 324/253 |
| 3,936,949 | 2/1976 | Devaud | 324/255 |
| 4,290,018 | 9/1981 | Rhodes | 324/255 |
| 4,314,200 | 2/1982 | Marck | 324/117 R |

FOREIGN PATENT DOCUMENTS 1012220 6/1949 France .

OTHER PUBLICATIONS

Heineche, "Fluxgate Magnet–Meter . . . " Conference in Precision Electromagnetic Measurements, 1978, pp. 89–90.

Primary Examiner—Reinhard J. Eisenzopf
Assistant Examiner—Walter E. Snow
Attorney, Agent, or Firm—Frishauf, Holtz, Goodman & Woodward

[57] ABSTRACT

A magnetometer with a time coding is proposed, which serves to measure magnetic fields in the motor vehicle and in particular to measure the direction of the earth field and to determine the driving direction. The magnetometer includes at least one sensor having a horizontally disposed, magnetizable rod-shaped core and a winding disposed on the core. The winding carries an alternating current for generating an auxiliary alternating field, in order to magnetize the core in alternation up to and into saturation. In order to measure the magnetic field detected by the sensor and to generate the auxiliary alternating current, a controlled alternating current source (18) is connected on the one hand to one and the same winding (19), and on the other hand a measurement voltage that can be picked up at this winding (19) is connected to an evaluation circuit (21, 25, 12, 13). The degree of deviation between the positive and negative half-waves of the measurement voltage represents a measure for the magnitude of the magnetic field measured. The magnetometer is intended for use as part of an electronic compass, preferably for navigational purposes in vehicles.

2 Claims, 3 Drawing Figures

MAGNETOMETER WITH TIME CODED OUTPUT OF MEASURED MAGNETIC FIELDS

The invention relates to a magnetometer with time coded output of measured magnetic fields. Background: The use of magnetometers with time coding for measuring the earth's magnetic fields is already known from German Patent No. 16 23 577. The magnetometer includes a sensor having a magnetizable rod-shaped core, on which two windings are arranged. One winding serves to generate an auxiliary alternating field, by being connected to an alternating voltage by means of which the core is magnetized in alternation up to and into saturation. At the other winding, a measurement voltage is picked up, which serves to ascertain the magnetic field that is to be measured. To this end, the measurement voltage is differentiated with a resistor-capacitor element. By means of the magnetic field that is to be measured, which acts in the direction of the sensor axis, a time shift of the extreme values of the measurement voltage is effected, the magnitude of the shift being a measure for the intensity of the measured magnetic field. Via a comparator, the differentiated measurement voltage can be converted into a digital value corresponding to the intensity of the magnetic field. This arrangement has the disadvantage, however, that the magnetizable core must have two windings electrically separated from one another, and the measurement voltage must be delivered to a differentiating element before it can be evaluated further. Also, an hourglass-pinched magnetic core is used, which is expensive to manufacture.

With the present invention, the object is to reduce the expense of generating the evaluatable measurement voltage, while attaining good magnetometer measuring accuracy.

The magnetometer according to the invention has the advantage that only one winding needs to be disposed on the magnetizable core of the sensor, and hence the heretofore-required second winding can be omitted. A further simplification and an improvement in the measuring accuracy are attained by eliminating the differentiation stage, in which as a rule a temperature-dependent capacitor was required.

Advantageous further developments and improvements are attainable with certain preferred features. It is particularly advantageous if, in order to generate the auxiliary alternating field, the alternating current source is controlled by the voltage of a triangle (wave shape) generator. The result is a triangular premagnetizing current. The measurement voltage that can be picked up at the coil is composed of the voltage dropping at the copper (wire) resistance of the winding in order to generate the premagnetizing current, and the voltage induced in the winding by means of the change in flux in the rod-shaped core. However, it is particularly effective to use only the voltage induced in the winding in order to ascertain the intensity of the magnetized unidirectional field. To this end, by means of a subtracting amplifier, the auxiliary alternating voltage of the triangle generator is subtracted from the measurement voltage to such an extent that at its output, only an amplified induction voltage then appears. One output of the triangle generator and one end of the winding are connected to a common reference voltage, preferably ground. To amplify the voltage induced in the winding, the end of the winding that is not connected to reference voltage is connected to one input of the subtracting amplifier, and the output of the triangle generator that is not connected to reference voltage is connected to the other end of the subtracting amplifier.

DRAWING

One exemplary embodiment of the invention is shown in the drawing and described in further detail below.

DESCRIPTION OF THE EXEMPLARY EMBODIMENT

Figure 1:
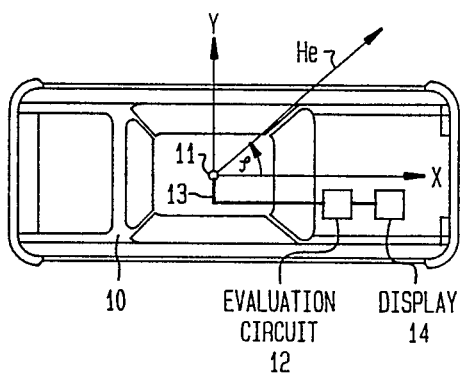
FIG. 1 shows a motor vehicle in which the driving direction is ascertained by measuring the earth field, using an electronic compass having a magnetometer.
Figure 2:
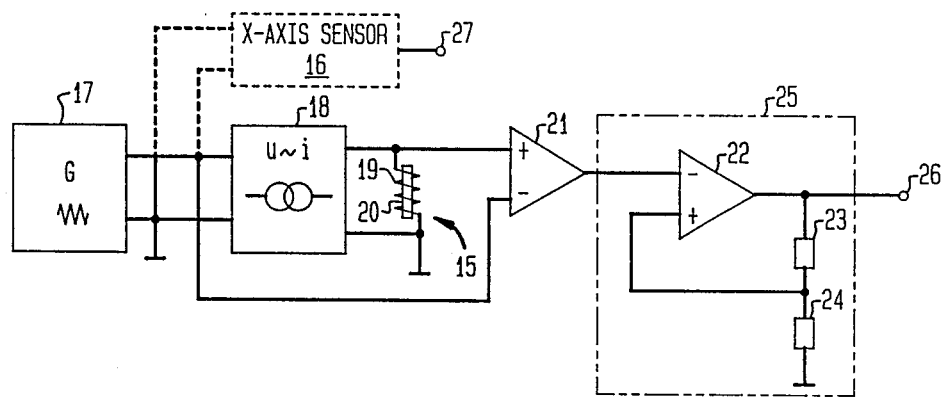
FIG. 2 shows the circuit of a magnetometer for measuring a magnetic field component detected by a sensor.

In FIG. 1, a motor vehicle is shown in plan view and identified by reference numeral 10. To determine the driving direction, the motor vehicle 10 is equipped with an electronic compass, which comprises a magnetometer 11 and an evaluation circuit 12. The magnetometer 11 is disposed under the roof of the motor vehicle 10, approximately in the middle of the vehicle, and is joined via a cable 13 with the evaluation circuit 12, which is accommodated in the dashboard of the vehicle 10. The evaluation circuit 12, provided with a computer, is connected to a visual display 14, which indicates to the driver either the instantaneous driving direction or perhaps the direction to be steered toward in order to reach a previously entered destination. The magnetometer 11 serves to measure the direction of the earth field with respect to the longitudinal axis of the motor vehicle 10. To this end, the magnetometer 11 is equipped with two sensors, offset by 90° from one another, one of which is shown in FIG. 2. One of the two sensors is located on the X axis and thus in the direction of the longitudinal axis of the motor vehicle 10, while the other sensor is located transversely to it, in the direction of the Y axis. The vector of the earth field $H_e$ forms an angle $\rho$ with the X axis. To ascertain this angle, the X component and the Y component, respectively, of the earth field $H_e$ are measured in the two sensors of the magnetometer 11, and the resultant measured values are delivered to the evaluation circuit 12, in which in a manner known per se the angle $\rho$ can be calculated and the driving direction, or the deviation between the driving direction and the direction to the previously specified destination, can be ascertained by means of the computer.

FIG. 2 shows the circuit layout of the magnetometer 11, in which the circuit branch having the sensor 15 located in the direction of the Y axis is shown in detail and will be described in detail below. The circuit branch for the sensor located in the direction of the X-axis, which is laid out identically, is shown in broken lines as circuit block 16, for the sake of simplicity. Both circuit branches are supplied by a triangle generator 17, at the output of which an auxiliary alternating voltage $U_h$, shown in FIG. 3, having an amplitude of 500 mV and a frequency of $f=1$ kHz appears. The output of the triangle generator 17 is connected to the input of a voltage controlled current source 18, with one connection being connected to ground voltage. The outputs of the current source 18 are connected to respective ends of a winding 19, which is disposed on a highly permeable, rod-shaped core 20 of the sensor 15. The winding 19 is likewise disposed with one end connected to ground voltage. The other end of the winding 19 is furthermore connected to the positive input of a subtracting amplifier 21, the negative input of which is connected to the output of the triangle generator 17 that is not connected to ground. The output of the subtracting amplifier 21 is connected to the input of a limit-value switch, which comprises a Schmitt trigger 25 having switching limits symmetrical to one another. Amplifier 21 and Schmitt trigger 25 form a part of the evaluation circuit. The Schmitt trigger comprises an operational amplifier 22, the negative input of which is connected to the output of the subtracting amplifier 21 and the positive input of which is connected to the pickup of a voltage divider comprising the resistors 23 and 24 and located between the output of the operational amplifier 22 and the ground voltage. The circuit block 16 likewise includes, for the sensor located in the X direction and not shown, a voltage-controlled current source 18, a subtracting amplifier 21 and a Schmitt trigger 25, laid out in a corresponding manner. The outputs 26 and 27 of the circuit layout are to be connected to the rest of the evaluation circuit 12, 14 (FIG. 1) via the cable 13.

Figure 3:
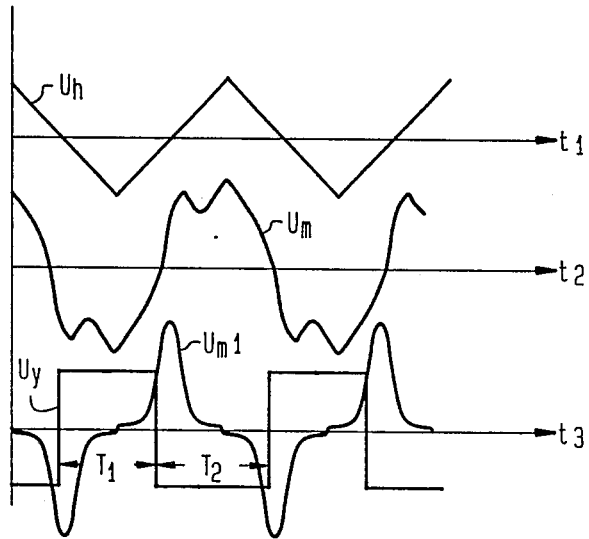
FIG. 3 shows the course of the voltage at various points in the circuit of FIG. 2.

The functioning of the magnetometer 11 will now be explained in further detail, referring to the voltage courses shown in FIG. 3. The auxiliary alternating voltage $U_h$ appearing at the output of the triangle generator 17 is plotted on the time axis $t_1$. It controls the current source 18 in such a manner that in the winding 19 connected to its output, a correspondingly triangular auxiliary alternating current appears, which generates an auxiliary alternating field in the magnetizable core 20 of the sensor 15. By means of this auxiliary alternating field, the core 20 is magnetized in alternation, that is, in alternating directions, up to and into saturation. Since the core 20 is also traversed by the Y component of the earth field $H_e$ (FIG. 1), the two fields are superimposed on one another in the core 20. The Y component of the earth field $H_e$ embodies the magnetic field that is to be measured with the sensor 15 and which traverses the core 20 in only one direction and thereby causes the core 20 to enter the saturation range earlier in one magnetizing direction, while in contrast it delays saturation in the opposite magnetizing direction. The magnetic field to be measured and the auxiliary alternating field generated by the alternating current, together with the applied voltage at the winding 19 which drives the magnetizing current, generate a measurement voltage $U_m$, which is plotted in FIG. 3 on the time axis $t_2$. By means of the subtracting amplifier 21, the auxiliary alternating voltage $U_h$ of the triangle generator 17 is now subtracted from the measurement voltage $U_m$ to such an extent that at the output of the subtracting amplifier 21, the amplified measurement voltage $U_m1$ plotted on the time axis $t_3$ now appears, which corresponds to the voltage induced in the winding 19 by the entire magnetic field. The positive and negative half-waves of the measurement voltage $U_m$ at the winding 19 or of the amplified measurement voltage $Y_m1$ at the output of the subtracting amplifier 21 deviate from one another in accordance with the magnetic field that is to be measured. The magnitude of the deviation is a measure for the magnitude of the measured amgnetic field at the sensor 15 and hence is a measure for the U component of the earth field $H_e$. To ascertain this deviation between the positive and negative half-waves, the amplified measurement voltage $U_m1$ at the output of the subtracting amplifier 21 is applied to the input of the Schmitt trigger 25. The rectangular output voltage $U_y$ thereby generated at the output 26 and plotted on the time axis $t_3$ is delivered to the evaluation circuit 12 (FIG. 1), and the duty cycle of the rectangular voltage, that is, the ratio of the duration $T_1$ of the positive amplitude to the duration $T_2$ of the negative amplitude represents a measure of the magnitude of the Y component of the earth field $H_e$. The duty cycle $T_1/(T_1+T_2)$ is ascertained by the computer, preferably a microcomputer, of the evaluation circuit 12 and further processed or stored.

In the same manner, the X component of the earth field $H_e$ is ascertained in the circuit block 16 and delivered to the evaluation circuit 12 (FIG. 1) via the output 27 in the form of a pulse length modulated rectangular voltage having a duty cycle corresponding to the X component of the earth field. If the earth field that is to be ascertained is located core driving direction, that is, in the direction of the Y axis, then the magnetic field is measured only at one sensor. At the other sensor, the magnetic field component is equal to zero. Accordingly, at this sensor a measurement voltage is generated that has exactly identical positive and negative half-waves, and thus the duty cycle of the associated output voltage $U_y$ or $U_x$ becomes equal to 50%. To realize the circuit according to FIG. 2, known operational amplifiers, which are to be supplied with a stabilized direct voltage, can be used for the triangle generator 17, the voltage-controlled current source 18 and for the subtracting amplifier 21 and the Schmitt trigger 24.

Within the scope of the invention, it is also possible to use only one voltage controlled current source 18, as well as one subtracting amplifier 21 and only one Schmitt trigger 25, for both of the sensors, rotated by 90° with respect to one another, of the magnetometer 11, if the output of the current source 18 as well as the positive input of the subtracting amplifier 21 are each switched over from the one sensor 15 to the other at fixed time intervals. It would be equally conceivable for only the outputs of the subtracting amplifier 21 to be applied to a common Schmitt trigger by means of continuous switching reversals. In both cases, only one transmission line from the magnetometer 11 to the evaluation circuit 12 is required. However, it is also possible within the scope of the invention to combine the magnetometer 11, the evaluation circuit 12 and the display unit 14 three-dimensionally into an electronic compass. On the other hand, it is also possible to dispose only the two sensors at some suitable location in the motor vehicle, for instance under the rear window, separately from the remaining electronic system. Finally, the electronic compass can also be operated with only one sensor 15. In that case, the direction of the earth field and hence the direction of the magnetic north pole is ascertained by rotating the sensor 15, with the horizontally disposed magnetizable core 20, until such time as the magnetic field that is to be measured produces a maximum measured value.

We claim:

1. Magnetometer for time coded measurement of constant magnetic fields, comprising at least one sensor having
    a horizontally disposed magnetizable rod-shaped core (20) and
    a winding (19) disposed on the core (20), the winding carrying an alternating current for generating an auxiliary alternating magnetic field which magnetizes the core up to and into saturation alternately in each of two directions and, together with the magnetic field that is to be measured, generates a measurement voltage ($U_m$), the positive and negative half-waves of which deviate from one another as a function of the magnetic field that is to be measured, wherein a triangle generator (17) is provided, which generates an alternating triangular voltage ($U_h$) at one output thereof;

a controlled alternating current source (18) is provided, having an input connected to an alternating triangular voltage output ($U_h$) of said triangle generator (17) and outputs connected to respective ends of said winding (19) for generating said auxiliary alternating field;

a single winding (19) serves both to generate the auxiliary alternating field and to generate the measurement voltage ($U_m$), the winding having first and second ends, an evaluation circuit (12, 13, 21–25) is provided for evaluating the measurement voltage ($U_m$) that can be picked up at said single winding (19);

the first end of said winding being connected to said controlled alternating current source (18) and the second end of said winding being connected to said evaluation circuit (12, 13, 21–25);

one output of the triangle generator (17) and one end of the winding (19) are applied to a common reference voltage level;

said first end of said winding (19) is at reference voltage level and said second end is not at reference voltage level;

a subtracting amplifier (21), having first and second inputs, is provided for evaluating the measurement voltage ($U_m$);

said second end of said winding (19) is connected to said second input of said subtracting amplifier (21);

said triangle generator (17) has a first output that is at reference voltage level and a second output that is not at reference voltage level, and said second output of said triangle generator is connected with said first input of the subtracting amplifier.

2. Magnetometer according to claim 1, characterized in that the output of the subtracting amplifier (21) is connected to the input of a Schmitt trigger (25), the output (26) of which is connected to a computer of the evaluation circuit (12).

* * * * *